(12) United States Patent
Harada

(10) Patent No.: US 11,251,829 B2
(45) Date of Patent: Feb. 15, 2022

(54) RADIO FREQUENCY MODULE

(71) Applicant: Murata Manufacturing Co., Ltd., Kyoto (JP)

(72) Inventor: Tetsuro Harada, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 28 days.

(21) Appl. No.: 17/022,369

(22) Filed: Sep. 16, 2020

(65) Prior Publication Data

US 2021/0006283 A1 Jan. 7, 2021

Related U.S. Application Data

(63) Continuation of application No. PCT/JP2019/006208, filed on Feb. 20, 2019.

(30) Foreign Application Priority Data

May 10, 2018 (JP) .............................. JP2018-091765

(51) Int. Cl.
*H04B 1/50* (2006.01)
*H01Q 1/38* (2006.01)
(Continued)

(52) U.S. Cl.
CPC ................ *H04B 1/50* (2013.01); *H01Q 1/38* (2013.01); *H04B 1/04* (2013.01); *H05K 1/02* (2013.01); *H04B 2001/0408* (2013.01)

(58) Field of Classification Search
CPC . H01L 23/12; H01L 2224/16225; H04B 1/44; H04B 1/0458; H04B 2001/0408;
(Continued)

(56) References Cited

U.S. PATENT DOCUMENTS

2010/0062727 A1 3/2010 Kemmochi et al.
2010/0253435 A1* 10/2010 Ichitsubo ................ H01L 25/18
330/295

(Continued)

FOREIGN PATENT DOCUMENTS

JP 2003309198 A 10/2003
JP 2009224638 A 10/2009
(Continued)

OTHER PUBLICATIONS

International Search Report issued in Application No. PCT/JP2019/006208 dated, Apr. 23, 2019.
(Continued)

*Primary Examiner* — Aristocratis Fotakis
(74) *Attorney, Agent, or Firm* — Pearne & Gordon LLP

(57) ABSTRACT

A radio frequency module is provided. A matching circuit includes an inductor which is connected in series to the power amplifier and is formed in a substrate. The substrate includes a ground layer, a low permittivity portion, and a high permittivity portion. The ground layer at least partially overlaps with a first input terminal of the low-noise amplifier in a plan view from a thickness direction of the substrate. The low permittivity portion at least partially overlaps with the first input terminal in a plan view from the thickness direction, and is provided between the first input terminal and the ground layer. The high permittivity portion is in contact with the inductor and has the permittivity greater than the permittivity of the low permittivity portion.

13 Claims, 7 Drawing Sheets

(51) Int. Cl.
*H05K 1/02* (2006.01)
*H04B 1/04* (2006.01)

(58) Field of Classification Search
CPC ............ H05K 1/024; H05K 2201/0187; H03F 2200/451; H03F 3/195; H03H 7/463
See application file for complete search history.

(56) References Cited

U.S. PATENT DOCUMENTS

| | | |
|---|---|---|
| 2011/0037170 A1 | 2/2011 | Shinohara |
| 2016/0037640 A1* | 2/2016 | Takai ................... H01L 23/3107 361/753 |
| 2017/0194993 A1* | 7/2017 | Watanabe ................ H04B 1/16 |
| 2018/0226928 A1* | 8/2018 | Obiya ...................... H04B 1/18 |
| 2019/0036488 A1* | 1/2019 | Nakajima ............... H03F 3/193 |
| 2019/0214703 A1* | 7/2019 | Choi .................... H01Q 21/061 |
| 2020/0203488 A1* | 6/2020 | Then ....................... H01L 29/93 |

FOREIGN PATENT DOCUMENTS

| | | |
|---|---|---|
| JP | 2010161812 A | 7/2010 |
| JP | 2011040602 A | 2/2011 |
| JP | 2011082797 A | 4/2011 |

OTHER PUBLICATIONS

Written Opinion issued in Application No. PCT/JP2019/006208 dated, Apr. 23, 2019.

\* cited by examiner

RADIO FREQUENCY MODULE

This is a continuation of International Application No. PCT/JP2019/006208 filed on Feb. 20, 2019 which claims priority from Japanese Patent Application No. 2018-091765 filed on May 10, 2018. The contents of these applications are incorporated herein by reference in their entireties.

BACKGROUND

The present disclosure generally relates to a radio frequency module, and in more detail, to a radio frequency module including a low-noise amplifier and a power amplifier.

There has been known a semiconductor module (radio frequency module) including a semiconductor chip constituting a low-noise amplifier, a semiconductor chip constituting a power amplifier, and a wiring substrate (see, for example, Japanese Unexamined Patent Application Publication No. 2011-040602).

In the semiconductor module described in Japanese Unexamined Patent Application Publication No. 2011-040602, the wiring substrate is a multilayer wiring substrate (multilayer substrate) in which a plurality of insulator layers and a plurality of conductor layers are alternately laminated and integrated.

In addition, in the semiconductor module described in Japanese Unexamined Patent Application Publication No. 2011-040602, the semiconductor chip constituting the low-noise amplifier is flip-chip mounted on the wiring substrate to reduce the thickness of the semiconductor module.

In the semiconductor module, parasitic capacitance is generated between an input terminal of the low-noise amplifier and a ground layer formed of one conductor layer among the conductor layers in the wiring substrate, and a noise figure (NF) of the low-noise amplifier is increased.

In addition, in the semiconductor module, when a matching circuit connected to an output terminal of the power amplifier is provided in the wiring substrate, loss in the matching circuit may be increased in an inductor constituted by part of the conductor layer of the wiring substrate.

BRIEF SUMMARY

The present disclosure provides a radio frequency module capable of improving at least one of the NF of the low-noise amplifier and the loss of the power amplifier in an output side.

A radio frequency module according to an aspect of the present disclosure includes a substrate, a low-noise amplifier, a power amplifier, and a matching circuit. The substrate has a first main surface and a second main surface, and at least part of the substrate is dielectric. The low-noise amplifier includes a first input terminal and a first output terminal, amplifies a first radio frequency signal inputted to the first input terminal, and outputs the amplified first radio frequency signal from the first output terminal. The low-noise amplifier is flip-chip mounted on the first main surface of the substrate. The power amplifier includes a second input terminal and a second output terminal, amplifies a second radio frequency signal inputted to the second input terminal, and outputs the amplified second radio frequency signal from the second output terminal. The power amplifier is mounted on the first main surface or the second main surface of the substrate. The matching circuit is electrically connected to the second output terminal of the power amplifier. The matching circuit includes an inductor connected in series to the power amplifier and formed on the first main surface or in the substrate. The substrate includes a ground layer, a low permittivity portion, and a high permittivity portion. The ground layer at least partially overlaps with the first input terminal in a plan view from a thickness direction of the substrate. The low permittivity portion at least partially overlaps with the first input terminal in the plan view, and is provided between the first input terminal and the ground layer. The high permittivity portion is in contact with the inductor, and has permittivity greater than the permittivity of the low permittivity portion.

Other features, elements, characteristics and advantages of the present disclosure will become more apparent from the following detailed description of embodiments of the present disclosure with reference to the attached drawings.

DETAILED DESCRIPTION

Figure 1:
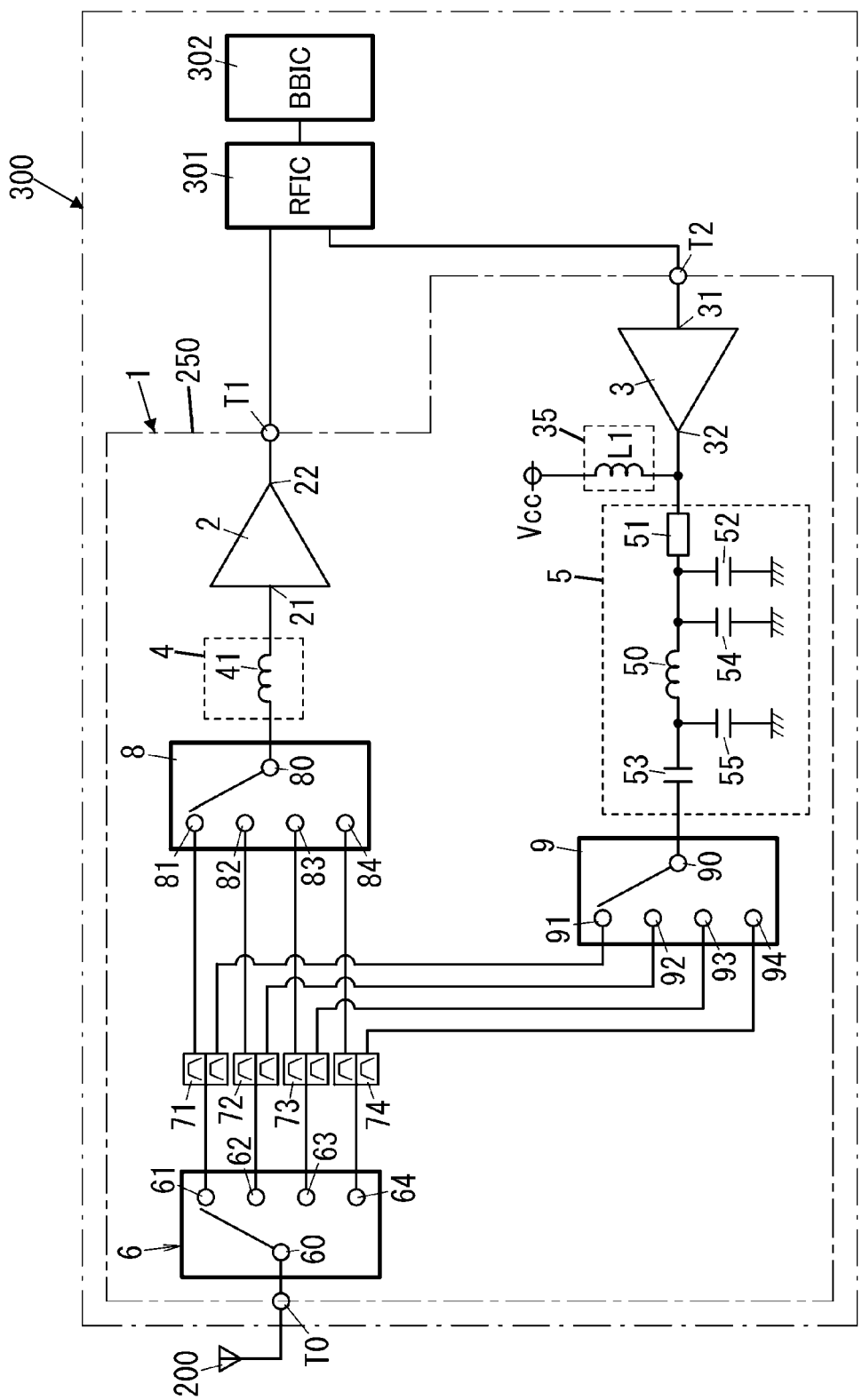
FIG. 1 is a configuration diagram of a communication unit including a radio frequency module according to Embodiment 1 of the present disclosure.

FIGS. 2 to 7 which are referred to in the following Embodiment 1 to Embodiment 6 are schematic drawings, and each ratio of the sizes and thicknesses of the respective components in the drawings does not necessarily reflect the actual dimensional ratio.

Embodiment 1

Hereinafter, a radio frequency module according to Embodiment 1 and a communication unit including the same will be described with reference to the drawings.

(1) Circuit Configuration of Radio Frequency Module and Communication Unit Including the Same A radio frequency module 1 according to Embodiment 1 constitutes a radio frequency front-end circuit 250 of a mobile communication device (mobile phone or the like, for example) supporting multi-band and carrier aggregation, for example. Firstly, a circuit configuration of the radio frequency module 1 according to Embodiment 1 and a communication unit 300 including the same will be described with reference to FIG. 1.

As illustrated in FIG. 1, the radio frequency module 1 includes an antenna terminal T0, a signal output terminal T1, and a signal input terminal T2. The radio frequency module 1 also includes an antenna switch 6, a plurality of (four, for example) duplexers 71 to 74, a first switch 8, a low-noise amplifier 2, a first matching circuit 4, a power amplifier 3, a second matching circuit 5, and a second switch 9. The communication unit 300 includes the radio frequency module 1, an RF signal processing circuit 301, and a baseband signal processing circuit 302. The radio frequency front-end circuit 250 constituted by the radio frequency module 1 transfers radio frequency signals (first radio frequency signal and second radio frequency signal) between an antenna 200 and the RF signal processing circuit 301.

The antenna terminal T0 of the radio frequency module 1 is connected to the antenna 200. The signal output terminal T1 and the signal input terminal T2 of the radio frequency module 1 are connected to the RF signal processing circuit 301. The RF signal processing circuit 301 is a radio frequency integrated circuit (RFIC), for example, and performs signal processing on the first radio frequency signal (received signal) amplified by the low-noise amplifier 2. The RF signal processing circuit 301 performs signal processing, such as down-conversion on the first radio frequency signal (received signal) inputted from the antenna 200 via the radio frequency module 1 (radio frequency front-end circuit 250), and outputs the received signal generated by the signal processing to the baseband signal processing circuit 302. The baseband signal processing circuit 302 is a baseband integrated circuit (BBIC), for example. The received signal processed by the baseband signal processing circuit 302 is used as an image signal for image display or as a voice signal for a call, for example.

The RF signal processing circuit 301 performs signal processing, such as up-conversion on the transmission signal outputted from the baseband signal processing circuit 302, and outputs a transmission signal (second radio frequency signal) subjected to the signal processing to the power amplifier 3, for example. The baseband signal processing circuit 302 performs predetermined signal processing on a transmission signal from the outside of the communication unit 300 including the radio frequency module 1, the RF signal processing circuit 301, and the baseband signal processing circuit 302, for example.

The antenna switch 6 of the radio frequency module 1 is provided between the antenna terminal T0 and the plurality of (four) duplexers 71 to 74. The antenna switch 6 includes one common terminal 60 and a plurality of (four) selection terminals 61 to 64. The common terminal 60 of the antenna switch 6 is connected to the antenna terminal T0. The plurality of selection terminals 61 to 64 of the antenna switch 6 is connected to the plurality of duplexers 71 to 74 in a one-to-one manner.

The pass bands of the plurality of duplexers 71 to 74 are different from one another. The duplexers 71 to 74 are connected to the first switch 8 and the second switch 9.

Each of the duplexers 71 to 74 includes a reception-side filter and a transmission-side filter. The reception-side filter passes the first radio frequency signal in a reception frequency band (pass band including a communication band for reception in a first frequency band), and attenuates a signal outside the reception frequency band. The transmission-side filter passes the second radio frequency signal of a transmission frequency band (pass band including a communication band for transmission in a second frequency band), and attenuates a signal outside the transmission frequency band. Each of the reception-side filter and the transmission-side filter is a surface acoustic wave (SAW) filter, for example, but is not limited to the SAW filter, and may be a bulk acoustic wave (BAW) filter or a dielectric filter, for example.

The plurality of duplexers 71 to 74 has transmission frequency bands and reception frequency bands different from one another. In addition, in the plurality of duplexers 71 to 74, an output terminal of the reception-side filter is used as a reception terminal (Rx terminal) that outputs the first radio frequency signal (reception signal), and is connected to the first switch 8. In addition, in the plurality of duplexers 71 to 74, an input terminal of the transmission-side filter is used as a transmission terminal (Tx terminal) that receives the second radio frequency signal (transmission signal). The input terminals of the transmission-side filters in the plurality of duplexers 71 to 74 are connected to the selection terminals 91 to 94 of the second switch 9 in a one-to-one manner. In addition, in the duplexers 71 to 74, terminals (ANT terminals), which are connected to the output terminals of the transmission-side filter and the input terminals of the reception-side filter, are connected to the selection terminals 61 to 64 of the antenna switch 6.

The first switch 8 has one common terminal 80 and a plurality of (four, for example) selection terminals 81 to 84. The plurality of selection terminals 81 to 84 of the first switch 8 is connected to the plurality of duplexers 71 to 74 in a one-to-one manner. The common terminal 80 of the first switch 8 is connected to the low-noise amplifier 2 via the first matching circuit 4. The first switch 8 is a switch IC (Integrated Circuit), for example. The first switch 8 connects the common terminal 80 and any one of the plurality of selection terminals 81 to 84 depending on a control signal from the RF signal processing circuit 301, for example.

The second switch 9 has one common terminal 90 and a plurality of (four) selection terminals 91 to 94. The common terminal 90 of the second switch 9 is connected to the power amplifier 3 via the second matching circuit 5. The second switch 9 is a switch IC (Integrated Circuit), for example. The second switch 9 connects the common terminal 90 and any one of the plurality of selection terminals 91 to 94 depending on a control signal from the RF signal processing circuit 301, for example.

The low-noise amplifier 2 has a first input terminal 21 and a first output terminal 22 for the first radio frequency signal. The low-noise amplifier 2 amplifies the first radio frequency signal inputted to the first input terminal 21, and outputs the amplified first radio frequency signal from the first output terminal 22. The first radio frequency signal is a radio frequency signal in the first frequency band.

The first input terminal 21 of the low-noise amplifier 2 is connected to the first matching circuit 4. The first input terminal 21 of the low-noise amplifier 2 is connected to the antenna terminal T0 via the first matching circuit 4, the first switch 8, one duplexer among the plurality of (four) duplexers 71 to 74, and the antenna switch 6. Further, the first output terminal 22 of the low-noise amplifier 2 is connected to the signal output terminal T1.

The power amplifier 3 has a second input terminal 31 and a second output terminal 32 for the second radio frequency signal. The power amplifier 3 amplifies the second radio frequency signal inputted to the second input terminal 31, and outputs the amplified second radio frequency signal from the second output terminal 32. Note that the radio frequency module 1 includes a bias circuit 35 for supplying an operation voltage Vcc to the power amplifier 3 from a control circuit. The bias circuit 35 includes a choke coil L1. The control circuit is a constituent element of the radio frequency module 1, but is not limited thereto, and may be a constituent element of the outside of the radio frequency module 1. In this case, the control circuit can be a constituent element of the communication unit 300, for example.

The second input terminal 31 of the power amplifier 3 is connected to the signal input terminal T2. Further, the second output terminal 32 of the power amplifier 3 is connected to the second matching circuit 5. The second output terminal 32 of the power amplifier 3 is connected to the antenna terminal T0 via the second matching circuit 5, the second switch 9, one duplexer among the plurality of (four) duplexers 71 to 74, and the antenna switch 6.

The power amplifier 3 amplifies a second radio frequency signal (transmission signal) inputted to the second input terminal 31 from the RF signal processing circuit 301 via the signal input terminal T2, and outputs the amplified second radio frequency signal from the second output terminal 32, for example. The power amplifier 3 is a multi-band power amplifier capable of amplifying the second radio frequency signal in a plurality of (four, for example) communication bands which are included in the second frequency band and of which bands are different from one another.

The first matching circuit 4 is an impedance matching circuit for matching the output impedance of a circuit provided in the front stage of the first matching circuit 4 with the input impedance of the circuit provided in the subsequent stage of the first matching circuit 4. In more detail, the first matching circuit 4 is provided between the first switch 8 and the low-noise amplifier 2, and is electrically connected to the first switch 8 and the first input terminal 21 of the low-noise amplifier 2. The first matching circuit 4 adjusts the impedance (input impedance of the low-noise amplifier 2) of the antenna terminal T0 side to 50Ω, for example, the impedance viewed from the low-noise amplifier 2 in the first frequency band. The first matching circuit 4 includes a first circuit element 41 as a constituent element thereof, for example. The first circuit element 41 is an inductor. In the first matching circuit 4, one end of the first circuit element 41 (inductor) is connected to the first input terminal 21 of the low-noise amplifier 2, and the other end of the first circuit element 41 is connected to the common terminal 80 of the first switch 8.

The second matching circuit 5 is a circuit for matching the output impedance of the power amplifier 3 provided in the front stage of the second matching circuit 5 with the input impedance of the circuit provided in the subsequent stage of the second matching circuit 5. In more detail, the second matching circuit 5 is provided between the power amplifier 3 and the second switch 9, and adjusts the impedance of the antenna terminal T0 side to 50Ω, for example, the impedance viewed from the power amplifier 3 in the second frequency band. The second matching circuit 5 includes a plurality of (six, for example) second circuit elements 50 to 55, and is electrically connected to the second output terminal 32 of the power amplifier 3. The second circuit elements 51 and 50, which are connected in series to the second output terminal 32 of the power amplifier 3, among the plurality of second circuit elements 50 to 55 are inductors, and the remaining second circuit elements 52 to 55 are capacitors. In the second matching circuit 5, one end of the second circuit element 51 (inductor) is connected to the second output terminal 32 of the power amplifier 3, and the other end of the second circuit element 51 is connected to the second circuit element 52 (capacitor).

(2) Structure of Radio Frequency Module

Hereinafter, the structure of the radio frequency module 1 will be described with reference to FIG. 2.

In the radio frequency module 1, the low-noise amplifier 2 is a semiconductor chip. The power amplifier 3 is also a semiconductor chip. The inductor constituting the first circuit element 41 in the first matching circuit 4 is a chip inductor, for example. The inductor constituting the second circuit element 51 in the second matching circuit 5 is a wiring inductor, for example. The capacitor constituting the second circuit element 52 in the second matching circuit 5 is a chip capacitor, for example. The capacitor constituting each of the second circuit elements 53 to 55 (see FIG. 1) is a chip capacitor, for example. Note that the control circuit is a control IC (Integrated Circuit), for example.

The radio frequency module 1 includes a bump B21 bonded to the first input terminal 21 of the low-noise amplifier 2 and a bump B22 bonded to the first output terminal 22 of the low-noise amplifier 2. The radio frequency module 1 includes a bump B31 bonded to the second input terminal 31 of the power amplifier 3 and a bump B32 bonded to the second output terminal 32 of the power amplifier 3. Each of the bumps B21, B22, B31, and B32 has conductivity. The material for each of the bumps B21, B22, B31 and B32 is Au, Cu, solder, or the like, for example.

The radio frequency module 1 includes a substrate 10. In the substrate 10, the low-noise amplifier 2, the power amplifier 3, and the first circuit element 41 are mounted. In addition, the substrate 10 is provided with one second circuit element 51 at least connected in series to the power amplifier 3 among the plurality of second circuit elements 50 to 55. The first circuit element 41 is also mounted on the substrate 10. The antenna switch 6, the plurality of duplexers 71 to 74, the first switch 8, and the second switch 9 are also mounted on the substrate 10. The choke coil L1 of the bias circuit 35 is also mounted on the substrate 10. Note that although the constituting components of the control circuit are mounted on the substrate 10, the communication unit 300 may include the constituting components of the control circuit outside the radio frequency module 1.

The substrate 10 has a first main surface 11 and a second main surface 12. At least part of the substrate 10 is a dielectric material. The first main surface 11 and the second main surface 12 are opposite to each other in a thickness direction D1 of the substrate 10. The first main surface 11 and the second main surface 12 are opposite sides of the substrate 10.

The substrate 10 is a multilayer substrate including a plurality of (nine, for example) dielectric layers 103 and a plurality of (seven, for example) conductor pattern layers 104, and in more detail, is a low temperature co-fired ceramics (LTCC) substrate. The plurality of dielectric layers 103 and the plurality of conductor pattern layers 104 are laminated in the thickness direction D1 of the substrate 10. Each of the plurality of conductor pattern layers 104 is formed in a predetermined pattern. Each of the plurality of conductor pattern layers 104 includes one or a plurality of conductor portions in a plane orthogonal to the thickness direction D1 of the substrate 10. The material of each conductor pattern layer 104 is copper, for example. The material of each conductor pattern layer 104 is not limited to copper, and may be silver, gold, or the like, for example. In addition, in the radio frequency module 1 it is not limited that the plurality of conductor pattern layers 104 is made of the same material, and the material of part of the conductor pattern layers 104 may be different from the material of other conductor pattern layers 104.

The substrate 10 includes a dielectric substrate 100, two electrodes E21 and E22 facing the low-noise amplifier 2 (hereinafter also referred to as first electrodes E21 and E22), two electrodes E31 and E32 facing the power amplifier 3 (hereinafter also referred to as second electrodes E31 and E32), and two ground layers 121 and 122.

The dielectric substrate 100 includes the plurality of dielectric layers 103. The dielectric substrate 100 has electrical insulation property. The dielectric substrate 100 has a plate-like shape. In a plan view from the thickness direction D1 of the substrate 10, the dielectric substrate 100 and the substrate 10 have a substantially rectangular shape, for example, but are not limited thereto, and may have a substantially square shape, for example. The outer peripheral shape of each of the plurality of dielectric layers 103 is the same as the outer peripheral shape of the dielectric substrate 100.

The dielectric substrate 100 has a first main surface 101 located on the low-noise amplifier 2 side and a second main surface 102 located on the opposite side of the low-noise amplifier 2. That is, the dielectric substrate 100 has the first main surface 101 and the second main surface 102 that are positioned on the sides of the substrate 10 opposite to each other in the thickness direction D1. The first main surface 101 and the second main surface 102 are opposite sides of the dielectric substrate 100. The first main surface 101 and the second main surface 102 intersect (are orthogonal to) the thickness direction D1 of the substrate 10. Here, each of the first main surface 101 and the second main surface 102 is a plane orthogonal to the thickness direction D1 of the substrate 10, but is not necessarily to be orthogonal thereto.

The two ground layers 121 and 122 are formed of conductor pattern layers 104 that are different from each other among the plurality of conductor pattern layers 104. The ground layers 121 and 122 are ground electrodes to which a ground potential is applied, for example. The ground layer 121 is positioned closer to the second main surface 102 side relative to the first main surface 101 of the dielectric substrate 100. The two ground layers 121 and 122 may be electrically connected to each other by a via conductor or may not be connected to each other.

Each of the electrodes E21, E22, E31, and E32 is included in one conductor pattern layer 104 among the plurality of conductor pattern layers 104. The material of each of the electrodes E21, E22, E31 and E32 is copper, for example.

The two first electrodes E21 and E22 are provided on the first main surface 101 of the dielectric substrate 100. The first electrode E21, which is one of the two first electrodes E21 and E22, faces the first input terminal 21 of the low-noise amplifier 2, and the bump B21 is bonded thereto. Further, the first electrode E22, which is the other of the two first electrodes E21 and E22, faces the first output terminal 22 of the low-noise amplifier 2, and the bump B22 is bonded thereto.

The two second electrodes E31 and E32 are provided on the first main surface 101 of the dielectric substrate 100. The second electrode E31, which is one of the two second electrodes E31 and E32, faces the second input terminal 31 of the power amplifier 3, and the bump B31 is bonded thereto. Further, the second electrode E32, which is the other of the two second electrodes E31 and E32, faces the second output terminal 32 of the power amplifier 3, and the bump B32 is bonded thereto.

The two ground layers 121 and 122 are provided in the dielectric substrate 100. The two ground layers 121 and 122 intersect (are orthogonal to) the thickness direction D1 of the substrate 10. One ground layer 121 of the two ground layers 121 and 122 (hereinafter, also referred to as first ground layer 121) faces the two first electrodes E21 and E22 in the thickness direction D1 of the substrate 10. In other words, the first ground layer 121 overlaps with the two first electrodes E21 and E22 in a plan view from the thickness direction D1 of the substrate 10. Further, the other ground layer 122 (hereinafter, also referred to as second ground layer 122) of the two ground layers 121 and 122 faces the two second electrodes E31 and E32 in the thickness direction D1 of the substrate 10. In other words, the second ground layer 122 overlaps with the two second electrodes E31 and E32 in a plan view from the thickness direction D1 of the substrate 10.

In addition, the substrate 10 further includes a land E41 (hereinafter also referred to as first land E41) and a wiring 150. The first land E41 is provided on the first main surface 101 of the dielectric substrate 100, and is connected to the first circuit element 41. The wiring 150 connects the first electrode E21 and the first land E41. With this, the wiring 150 electrically connects the first input terminal 21 of the low-noise amplifier 2 and the first circuit element 41.

The wiring 150 includes a first via conductor 151, a second via conductor 152, and a conductor portion 153. The first via conductor 151 is provided in the dielectric substrate 100. The first via conductor 151 overlaps with the first electrode E21 in the thickness direction D1 of the substrate 10 and is connected to the first electrode E21. The second via conductor 152 is provided in the dielectric substrate 100. The second via conductor 152 overlaps with the first circuit element 41 in the thickness direction D1 of the substrate 10 and is electrically connected to the first circuit element 41. Here, the second via conductor 152 is connected to the first land E41. The conductor portion 153 is provided in the dielectric substrate 100. The conductor portion 153 connects the first via conductor 151 and the second via conductor 152.

Each of the first via conductor 151 and the second via conductor 152 penetrates through the one dielectric layer 103 closest to the low-noise amplifier 2 in the thickness direction D1 of the substrate 10 among the plurality of dielectric layers 103. The conductor portion 153 is interposed between the dielectric layer 103 closest to the low-noise amplifier 2 and the dielectric layer 103 second closest to the low-noise amplifier 2 in the thickness direction D1 of the substrate 10 among the plurality of dielectric layers 103. The material of the first via conductor 151 and the second via conductor 152 is the same material as that of each conductor pattern layer 104, for example. Therefore, the material of the first via conductor 151 and the second via conductor 152 is copper, for example. The material of the first via conductor 151 and the second via conductor 152 is not limited to copper and may be silver, gold, or the like, for example. The size of the first via conductor 151 in a plan view from the thickness direction D1 of the substrate 10 is approximately the same as that of the bump B21, for example. The size of the bump B21 and the first via conductor 151 in a plan view from the thickness direction D1 is smaller than that of the first electrode E21, for example.

In addition, the substrate 10 includes a land E52 (hereinafter, also referred to as second land E52), a third via conductor 161, a wiring inductor 160, and a fourth via conductor 162. The second land E52 is provided on the first main surface 101 of the dielectric substrate 100, and is connected to the second circuit element 52 (capacitor). The wiring inductor 160 constitutes the second circuit element 51 (inductor). In the substrate 10, the second electrode E32 and the second land E52 are connected to each other using the third via conductor 161, the wiring inductor 160, and the fourth via conductor 162. With this, in the radio frequency module 1, the second output terminal 32 of the power amplifier 3 and the second circuit element 51 (inductor) are connected, and the second circuit element 51 and the second circuit element 52 (capacitor) are connected. The wiring inductor 160 and the conductor portion 153 are included in the same conductor pattern layer.

The substrate 10 includes a low permittivity portion 130. The low permittivity portion 130 is provided between the first input terminal 21 of the low-noise amplifier 2 and the first ground layer 121. In more detail, the low permittivity portion 130 is provided in the dielectric substrate 100 between the first input terminal 21 of the low-noise amplifier 2 and the first ground layer 121. In addition, at least part of the low permittivity portion 130 overlaps with the first input terminal 21 in a plan view from the thickness direction D1 of the substrate 10. The low permittivity portion 130 according to Embodiment 1 is provided at a position overlapping with the entirety of the conductor portion 153 in a plan view from the thickness direction D1 of the substrate 10. Part of the conductor portion 153 overlaps with the first input terminal 21 in a plan view from the thickness direction D1 of the substrate 10.

In addition, the substrate 10 includes a high permittivity portion 140. The permittivity of the high permittivity portion 140 is greater than the permittivity of the low permittivity portion 130. The high permittivity portion 140 is in contact with the second circuit element 51 (inductor) in the second matching circuit 5. The high permittivity portion 140 is positioned closer to the second main surface 12 side of the substrate 10 relative to the second circuit element 51.

In the radio frequency module 1 according to Embodiment 1, the low permittivity portion 130 is a gas (air) in a cavity 129 formed in the dielectric substrate 100. In the radio frequency module 1 according to Embodiment 1, the cavity 129 is formed so as to penetrate through the two dielectric layers 103 in the thickness direction D1 of the dielectric substrate 100. In the radio frequency module 1, the distance between the low permittivity portion 130 and the first input terminal 21 can be further shorter in the thickness direction D1 of the substrate 10. In addition, in the radio frequency module 1 according to Embodiment 1, the material of the high permittivity portion 140 is the same as that of the dielectric substrate 100. In the radio frequency module 1 according to Embodiment 1, the high permittivity portion 140 is constituted by a portion of the dielectric layer 103 second closest to the power amplifier 3 and a portion of the dielectric layer 103 third closest to the power amplifier 3 in the thickness direction D1 among the plurality of dielectric layers 103, for example. The permittivity of the high permittivity portion 140 is the same as the permittivity of the dielectric substrate 100.

A method for manufacturing the substrate 10 including the cavity 129 as an example follows. A material (carbon paste or the like, for example) containing carbon is filled in a through hole provided in a region where the cavity 129 is to be formed in two ceramic green sheets among the plurality of ceramic green sheets which are the bases of the plurality of dielectric layers 103. The conductor pattern layer 104 or the like and the plurality of ceramic green sheets formed in advance are pressed to form a multilayer body. The multilayer body is fired. The firing temperature is about 900° C., for example. The material containing carbon is a material capable of extinguishing during firing of the multilayer body of the plurality of ceramic green sheets. The method for manufacturing the substrate 10 including the cavity 129 is not limited to the above-described example. The substrate 10 including the cavity 129 may be formed by firing a multilayer body of the plurality of ceramic green sheets without necessarily filling the through hole with a material containing carbon, for example.

The low permittivity portion 130 is provided between a portion of the wiring 150 facing the ground layer 121 in the thickness direction D1 of the substrate 10 and the ground layer 121. In the substrate 10, the one dielectric layer 103 (portion thereof) is interposed between the low permittivity portion 130 and the ground layer 121 in the thickness direction D1, but the present disclosure is not limited thereto. For example, in the substrate 10, the dielectric layer 103 may not be interposed between the low permittivity portion 130 and the ground layer 121, or two or more dielectric layers 103 may be interposed therebetween in the thickness direction D1.

The low permittivity portion 130 is provided between the conductor portion 153 and the ground layer 121 so as to overlap with the entirety of the wiring 150 (first via conductor 151, second via conductor 152, and conductor portion 153) in a plan view from the thickness direction D1. However, the present disclosure is not limited thereto. It is sufficient, for example, that the low permittivity portion 130 is provided between a portion of the conductor portion 153 at least overlapping with the first via conductor 151 and the ground layer 121 in a plan view from the thickness direction D1. In addition, the low permittivity portion 130 is not limited to air, and may be resin, for example.

(3) Effect

The radio frequency module 1 according to Embodiment 1 includes the substrate 10, the low-noise amplifier 2, the power amplifier 3, and the second matching circuit 5 (matching circuit). The substrate 10 has the first main surface 11 and the second main surface 12, and at least part of the substrate 10 is a dielectric material. The low-noise amplifier 2 has the first input terminal 21 and the first output terminal 22, amplifies the first radio frequency signal inputted to the first input terminal 21, and outputs the amplified first radio frequency signal from the first output terminal 22. The low-noise amplifier 2 is flip-chip mounted on the first main surface 11 of the substrate 10. The power amplifier 3 has the second input terminal 31 and the second output terminal 32, amplifies the second radio frequency signal inputted to the second input terminal 31, and outputs the amplified second radio frequency signal from the second output terminal 32. The power amplifier 3 is mounted on the first main surface 11 of the substrate 10. The second matching circuit 5 is electrically connected to the second output terminal 32 of the power amplifier 3. The second matching circuit 5 includes an inductor (second circuit element 51) which is formed in the substrate 10 and is connected in series to the power amplifier 3. The substrate 10 includes the ground layer 121, the low permittivity portion 130, and the high permittivity portion 140. The ground layer 121 at least partially overlaps with the first input terminal 21 in a plan view from the thickness direction D1 of the substrate 10. The low permittivity portion 130 at least partially overlaps with the first input terminal 21 in a plan view from the thickness direction D1 of the substrate 10, and is provided between the first input terminal 21 and the ground layer 121. The high permittivity portion 140 is in contact with the inductor (second circuit element 51), and has the permittivity greater than that of the low permittivity portion 130.

In the radio frequency module 1 according to Embodiment 1, it is possible to improve the NF of the low-noise amplifier 2. In more detail, in the radio frequency module 1 according to Embodiment 1, since the permittivity of the low permittivity portion 130 is smaller than the permittivity of the high permittivity portion 140, it is possible to reduce the parasitic capacitance generated between the first input terminal 21 of the low-noise amplifier 2 and the ground layer 121. Thus, in the radio frequency module 1 according to Embodiment 1, it is possible to improve the NF of the low-noise amplifier 2.

In the radio frequency module 1 according to Embodiment 1, the substrate 10 includes the dielectric substrate 100. The dielectric substrate 100 has the first main surface 101 and the second main surface 102. The first main surface 101 of the dielectric substrate 100 constitutes part of the first main surface 11 of the substrate 10. The second main surface 102 of the dielectric substrate 100 constitutes at least part of the second main surface 12 of the substrate 10. The substrate 10 satisfies a first condition. The first condition is a condition that satisfies: permittivity of low permittivity portion 130<permittivity of dielectric substrate 100≤permittivity of high permittivity portion 140. Thus, in the radio frequency module 1, it is possible to improve the NF of the low-noise amplifier 2.

Further, in the radio frequency module 1 according to Embodiment 1, the substrate 10 is an LTCC substrate. The substrate 10 satisfies the first condition. With this, in the radio frequency module 1 according to Embodiment 1, it is possible to improve both the NF of the low-noise amplifier 2 and the loss of the power amplifier 3 on the output side. Note that in the case where the substrate 10 is an LTCC substrate, the permittivity of the dielectric substrate 100 is about 3.9 to 7.0, for example.

Further, in the radio frequency module 1 according to Embodiment 1, the low permittivity portion 130 is air or resin. With this, in the radio frequency module 1 according to Embodiment 1, it is possible to make the permittivity of the low permittivity portion 130 smaller than the permittivity of the dielectric substrate 100.

In the radio frequency module 1 according to Embodiment 1, the high permittivity portion 140 is made of the same material as that of the dielectric substrate 100. As a result, in the radio frequency module 1 according to Embodiment 1, it becomes easy to form the high permittivity portion 140.

Further, in the radio frequency module 1 according to Embodiment 1, the substrate 10 further includes the wiring 150 electrically connecting the first circuit element 41 and the first input terminal 21. The low permittivity portion 130 is provided between a portion of the wiring 150 facing the ground layer 121 in the thickness direction D1 and the ground layer 121. With this, in the radio frequency module 1 according to Embodiment 1, it is possible to connect the first input terminal 21 of the low-noise amplifier 2 and the first circuit element 41 by the wiring 150 of the substrate 10. In addition, in the radio frequency module 1 according to Embodiment 1, since the parasitic capacitance generated between the wiring 150 having substantially the same electric potential as that of the first input terminal 21 and the ground layer 121 may be reduced, it is possible to reduce the NF of the low-noise amplifier 2.

In addition, in the radio frequency module 1 according to Embodiment 1, the first circuit element 41 is a chip inductor. The wiring 150 includes the first via conductor 151, the second via conductor 152, and the conductor portion 153. The first via conductor 151 is provided in the dielectric substrate 100, overlaps with the electrode E21 in the thickness direction D1, and is connected to the electrode E21. The second via conductor 152 is provided in the dielectric substrate 100, overlaps with the first circuit element 41 in the thickness direction D1, and is electrically connected to the first circuit element 41. The conductor portion 153 is provided in the dielectric substrate 100, and connects the first via conductor 151 and the second via conductor 152. The low permittivity portion 130 is provided between a portion of the conductor portion 153 overlapping with at least the first via conductor 151 in a plan view from the thickness direction D1 and the ground layer 121. With this, in the radio frequency module 1 according to Embodiment 1, it is possible to reduce the NF compared with the case where the low permittivity portion 130 is not provided between a portion overlapping with the first via conductor 151 in the thickness direction D1 and the ground layer 121, and the low permittivity portion 130 is provided between a portion not overlapping with the first via conductor 151 in the thickness direction D1 and the ground layer 121. In addition, in the radio frequency module 1 according to Embodiment 1, it is possible to reduce the region in which the low permittivity portion 130 is provided in a plane orthogonal to the thickness direction D1.

In addition, in the radio frequency module 1 according to Embodiment 1, the substrate 10 is an LTCC substrate. With this, in the radio frequency module 1 according to Embodiment 1, it is possible to make the permittivity of the dielectric substrate 100 greater compared with the case where the substrate 10 is a printed wiring board.

In addition, in the radio frequency module 1 according to Embodiment 1, the low permittivity portion 130 is a gas in the cavity 129 formed in the dielectric substrate 100. With this, in the radio frequency module 1 according to Embodiment 1, it is possible to further reduce the permittivity of the low permittivity portion 130.

Embodiment 2

Figure 3:
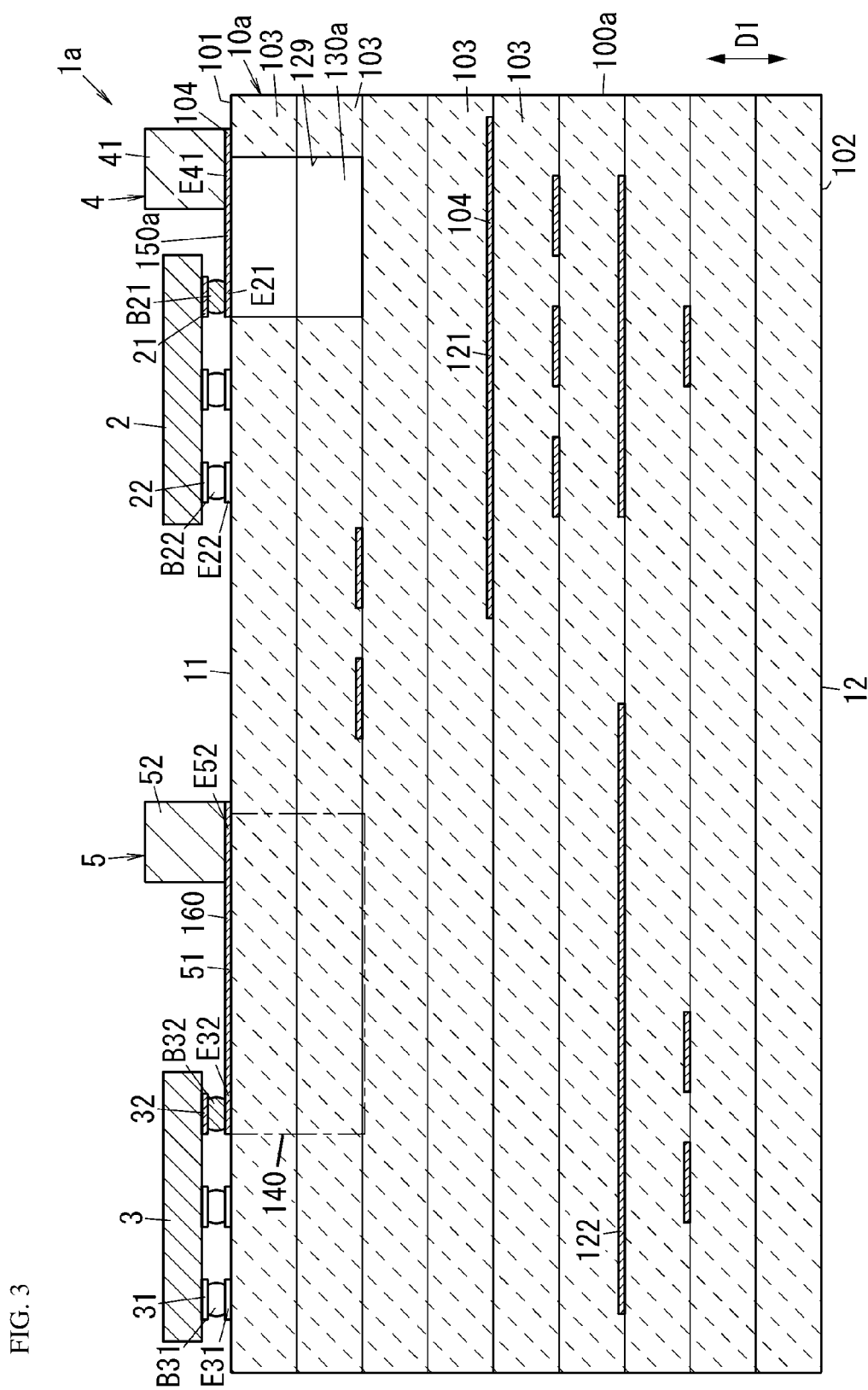
FIG. 3 is a cross-sectional view of a radio frequency module according to Embodiment 2 of the present disclosure.

Hereinafter, a radio frequency module 1a according to Embodiment 2 will be described with reference to FIG. 3.

Figure 2:
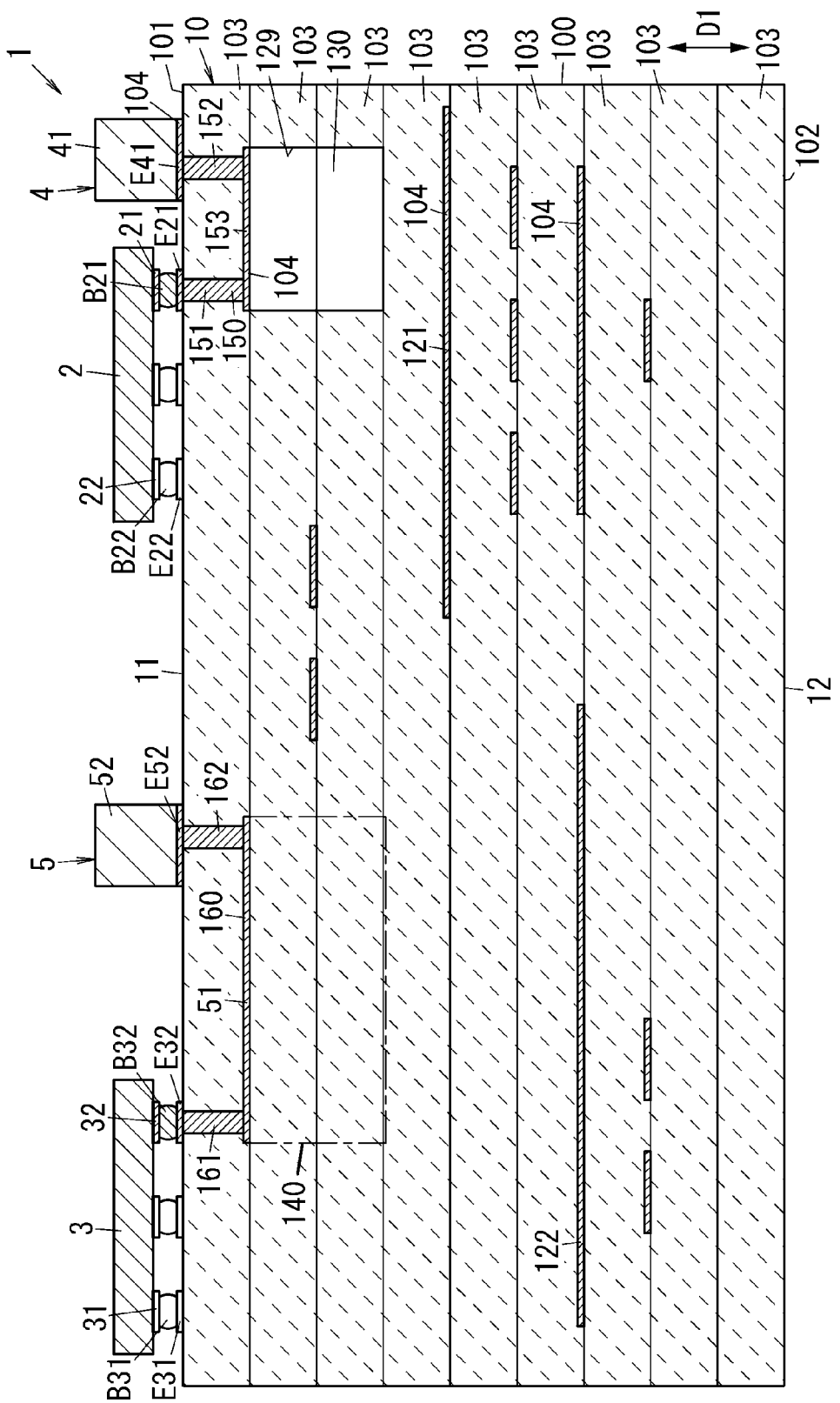
FIG. 2 is a cross-sectional view of the radio frequency module of the above.

In the radio frequency module 1a according to Embodiment 2, the position of a low permittivity portion 130a in a substrate 10a is different from the position of the low permittivity portion 130 in the substrate 10 of the radio frequency module 1 according to Embodiment 1 (see FIG. 2). In the radio frequency module 1a according to Embodiment 2, the configuration of a wiring 150a connecting the first input terminal 21 of the low-noise amplifier 2 and the first circuit element 41 differs from the configuration of the wiring 150 in the radio frequency module 1 according to Embodiment 1. With respect to the radio frequency module 1a according to Embodiment 2, the same components as those of the radio frequency module 1 according to Embodiment 1 are denoted by the same reference numerals, and the description thereof will be omitted as appropriate.

The wiring 150a is provided on the first main surface 101 of a dielectric substrate 100a and connects the electrode E21 and the land E41. The electrode E21, the land E41, and the wiring 150a are included in the conductor pattern layer 104 that is closest to the low-noise amplifier 2 in the thickness direction D1 of the substrate 10a. The electrode E21, the land E41, and the wiring 150a are integrated. Further, the wiring inductor 160 constituting the second circuit element 51 (inductor) is provided on the first main surface 101 of the dielectric substrate 100a, and connects the electrode E32 and the land E52. The electrode E32, the land E52, and the wiring inductor 160 are included in the conductor pattern layer 104 that is closest to the power amplifier 3 in the thickness direction D1 of the substrate 10a. The electrode E32, the land E52, and the wiring inductor 160 are integrated.

The low permittivity portion 130a is formed immediately below the electrode E21, the land E41, and the wiring 150a. The low permittivity portion 130a is air, but is not limited thereto, and may be resin, for example.

In the radio frequency module 1a according to Embodiment 2, similarly to the radio frequency module 1 according to Embodiment 1, the low permittivity portion 130a is provided at a position between the first input terminal 21 of the low-noise amplifier 2 and the ground layer 121, the position overlapping with at least the first input terminal 21 in a plan view from the thickness direction D1 of the substrate 10a. Further, the permittivity of the low permittivity portion 130a is smaller than the permittivity of the high permittivity portion 140. Therefore, in the radio frequency module 1a according to Embodiment 2, similarly to the radio frequency module 1 according to Embodiment 1, it is possible to improve the NF of the low-noise amplifier 2. In the radio frequency module 1a according to Embodiment 2, similarly to the radio frequency module 1 according to Embodiment 1, the substrate 10a is an LTCC substrate, and the substrate 10a satisfies the first condition. The first condition is a condition that satisfies: permittivity of low permittivity portion 130a<permittivity of dielectric substrate 100a≤permittivity of high permittivity portion 140. With this, in the radio frequency module 1a according to Embodiment 2, it is possible to improve both the NF of the low-noise amplifier 2 and the loss of the power amplifier 3 on the output side.

In the radio frequency module 1a according to Embodiment 2, the wiring 150a is provided on the first main surface 101 of the dielectric substrate 100a and connects the electrode E21 and the land E41. With this, in the radio frequency module 1a according to Embodiment 2, it is possible to further reduce the parasitic capacitance caused by the wiring 150a.

Embodiment 3

Figure 4:
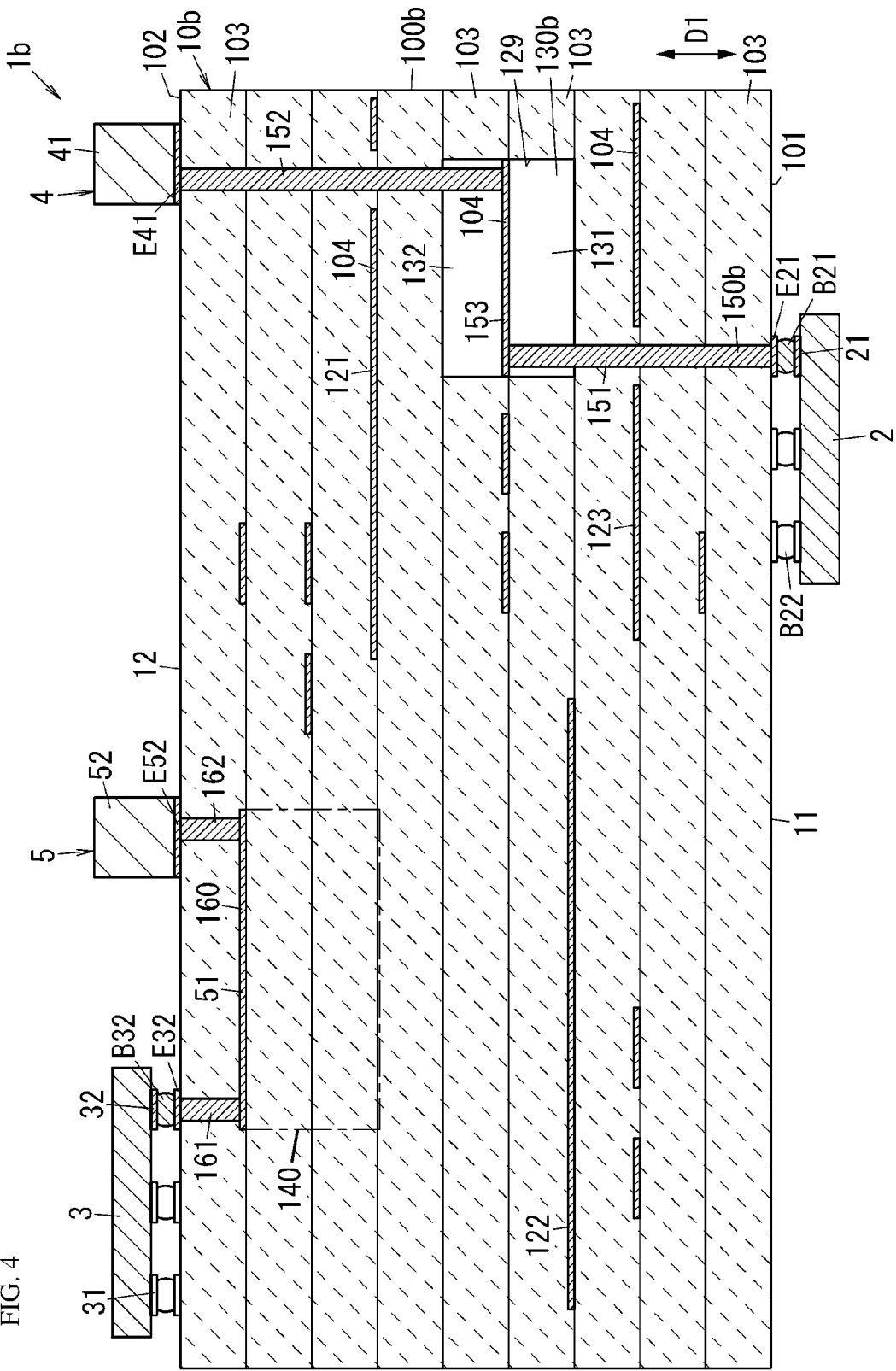
FIG. 4 is a cross-sectional view of a radio frequency module according to Embodiment 3 of the present disclosure.

Hereinafter, a radio frequency module 1b according to Embodiment 3 will be described with reference to FIG. 4.

The radio frequency module 1b according to Embodiment 3 is different from the radio frequency module 1 according to Embodiment 1 (see FIG. 2) in that the land E32 is provided on the second main surface 102 of a dielectric substrate 100b, and the power amplifier 3 is disposed on the second main surface 102 side of the dielectric substrate 100b. In the radio frequency module 1b according to Embodiment 3, the low-noise amplifier 2 is disposed on the first main surface 101 side of the dielectric substrate 100b, and the power amplifier 3 is disposed on the second main surface 102 side of the dielectric substrate 100b. That is, in the radio frequency module 1b according to Embodiment 3, the low-noise amplifier 2 is mounted on the first main surface 11 of the substrate 10b, and the power amplifier 3 is mounted on the second main surface 12 of the substrate 10b. In addition, in the radio frequency module 1b according to Embodiment 3, the land E52 connected to the second circuit element 52 (capacitor) is provided on the second main surface 102 of the dielectric substrate 100b. With respect to the radio frequency module 1b according to Embodiment 3, the same components as those of the radio frequency module 1 according to Embodiment 1 are denoted by the same reference numerals, and the description thereof will be omitted as appropriate.

In the radio frequency module 1b according to Embodiment 3, a wiring 150b connecting the first input terminal 21 of the low-noise amplifier 2 and the first circuit element 41 is provided in the dielectric substrate 100b so as to connect the electrode E21 on the first main surface 101 and the land E41 on the second main surface 102 of the dielectric substrate 100b. The first via conductor 151 penetrates through the four dielectric layers 103 from the dielectric layer 103 closest to the low-noise amplifier 2 to the dielectric layer 103 fourth closest to the low-noise amplifier 2 in the thickness direction D1 of the substrate 10b among the plurality of dielectric layers 103. In addition, the second via conductor 152 penetrates through the five dielectric layers 103 from the dielectric layer 103 closest to the power amplifier 3 to the dielectric layer 103 fifth closest to the power amplifier 3 in the thickness direction D1 of the substrate 10b among the plurality of dielectric layers 103.

The low permittivity portion 130b includes a low permittivity portion 131 formed in the dielectric layer 103 fourth closest to the low-noise amplifier 2, and a low permittivity portion 132 formed in the dielectric layer 103 fifth closest to the low-noise amplifier 2, in the thickness direction D1 of the substrate 10b among the plurality of dielectric layers 103.

In addition, the radio frequency module 1b according to Embodiment 3 includes a ground layer 123 (hereinafter, also referred to as third ground layer 123) interposed between the dielectric layer 103 second closest to the low-noise amplifier 2 and the dielectric layer 103 third closest to the low-noise amplifier 2 in the thickness direction D1 of the substrate 10b among the plurality of dielectric layers 103. The third ground layer 123 faces the conductor portion 153 in the thickness direction D1 of the substrate 10b. The third ground layer 123 is formed as a pattern that is not electrically connected to the first via conductor 151.

In the radio frequency module 1b according to Embodiment 3, similarly to the radio frequency module 1 according to Embodiment 1, the low permittivity portion 130b is provided at a position between the first input terminal 21 of the low-noise amplifier 2 and the ground layer 121, the position overlapping with at least the first input terminal 21 in a plan view from the thickness direction D1. Further, the permittivity of the low permittivity portion 130b is smaller than the permittivity of the high permittivity portion 140. Therefore, in the radio frequency module 1b according to Embodiment 3, similarly to the radio frequency module 1 according to Embodiment 1, it is possible to improve the NF of the low-noise amplifier 2. In the radio frequency module 1b according to Embodiment 3, similarly to the radio frequency module 1 according to Embodiment 1, the substrate 10b is an LTCC substrate and the substrate 10b satisfies the first condition. The first condition is a condition that satisfies: permittivity of low permittivity portion 130b<permittivity of dielectric substrate 100b≤permittivity of high permittivity portion 140. With this, in the radio frequency module 1b according to Embodiment 3, it is possible to improve both the NF of the low-noise amplifier 2 and the loss of the power amplifier 3 on the output side.

Embodiment 4

Figure 5:
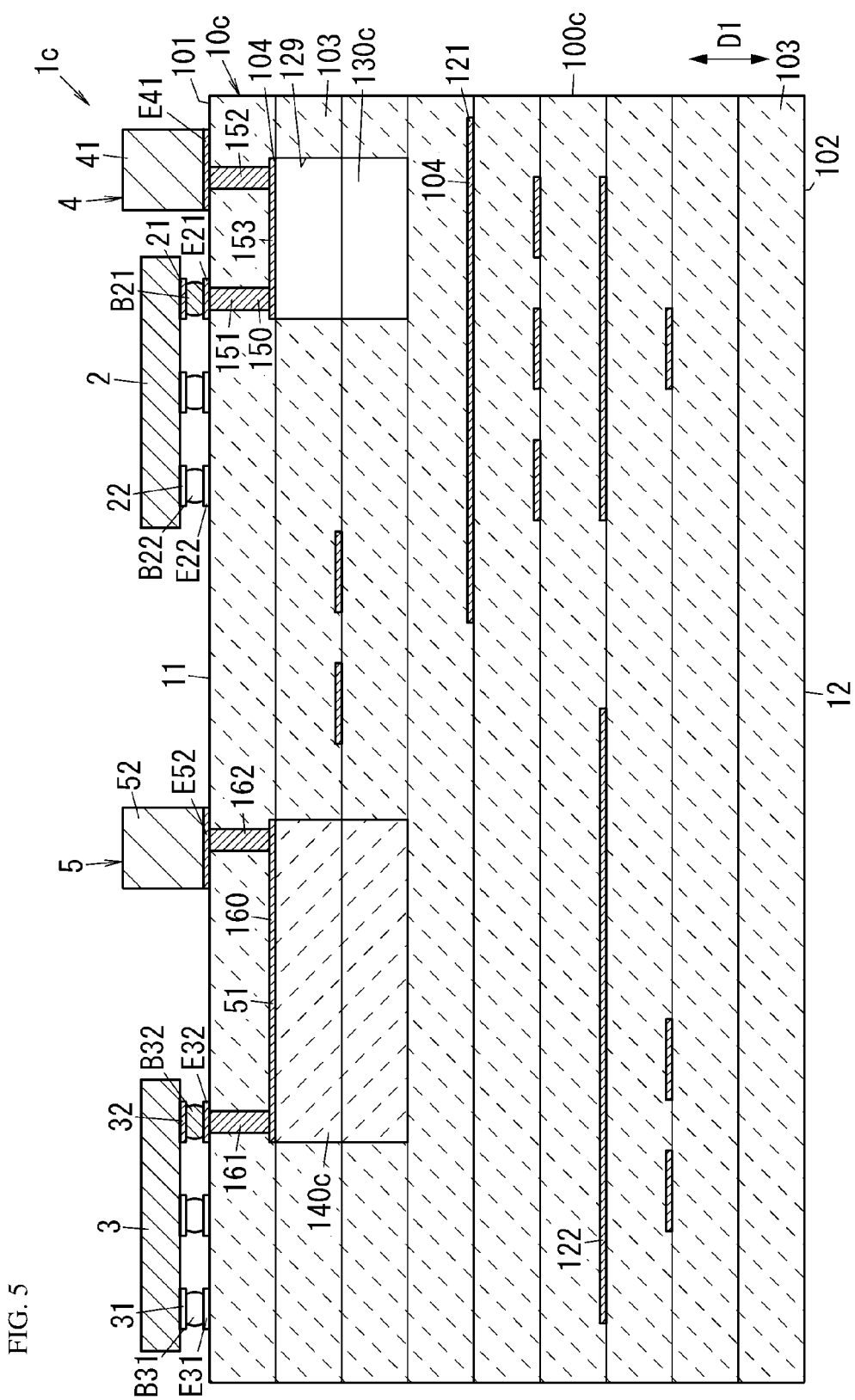
FIG. 5 is a cross-sectional view of a radio frequency module according to Embodiment 4 of the present disclosure.

Hereinafter, a radio frequency module 1c according to Embodiment 4 will be described with reference to FIG. 5.

The radio frequency module 1c according to Embodiment 4 differs from the radio frequency module 1 according to Embodiment 1 in that a material of a high permittivity portion 140c is different from that of the dielectric layer 103. The permittivity of the high permittivity portion 140c of the radio frequency module 1c according to Embodiment 4 is greater than the permittivity of the high permittivity portion 140 of the radio frequency module 1 according to Embodiment 1. With respect to the radio frequency module 1c according to Embodiment 4, the same components as those of the radio frequency module 1 according to Embodiment 1 are denoted by the same reference numerals, and the description thereof will be omitted as appropriate.

In the radio frequency module 1c according to Embodiment 4, similarly to the radio frequency module 1 according to Embodiment 1, the low permittivity portion 130c is provided at a position between the first input terminal 21 of the low-noise amplifier 2 and the ground layer 121, the position overlapping with at least the first input terminal 21 in a plan view from the thickness direction D1 of the substrate 10c. In addition, the permittivity of the low permittivity portion 130c is smaller than the permittivity of the high permittivity portion 140c. Therefore, in the radio frequency module 1c according to Embodiment 4, it is possible to improve the NF of the low-noise amplifier 2. In the radio frequency module 1c according to Embodiment 4, similarly to the radio frequency module 1 according to Embodiment 1, the substrate 10c is an LTCC substrate, and the substrate 10c satisfies the first condition. The first condition is a condition that satisfies: permittivity of low permittivity portion 130c<permittivity of dielectric substrate 100c≤permittivity of high permittivity portion 140c. With this, in the radio frequency module 1c according to Embodiment 4, it is possible to improve both the NF of the low-noise amplifier 2 and the loss of the power amplifier 3 on the output side. In the radio frequency module 1c according to Embodiment 4, since the permittivity of the high permittivity portion 140c is greater than the permittivity of the high permittivity portion 140 of the radio frequency module 1 according to Embodiment 1, it is possible to further suppress the loss of the power amplifier 3 on the output side, as compared with the radio frequency module 1 according to Embodiment 1.

Embodiment 5

Figure 6:
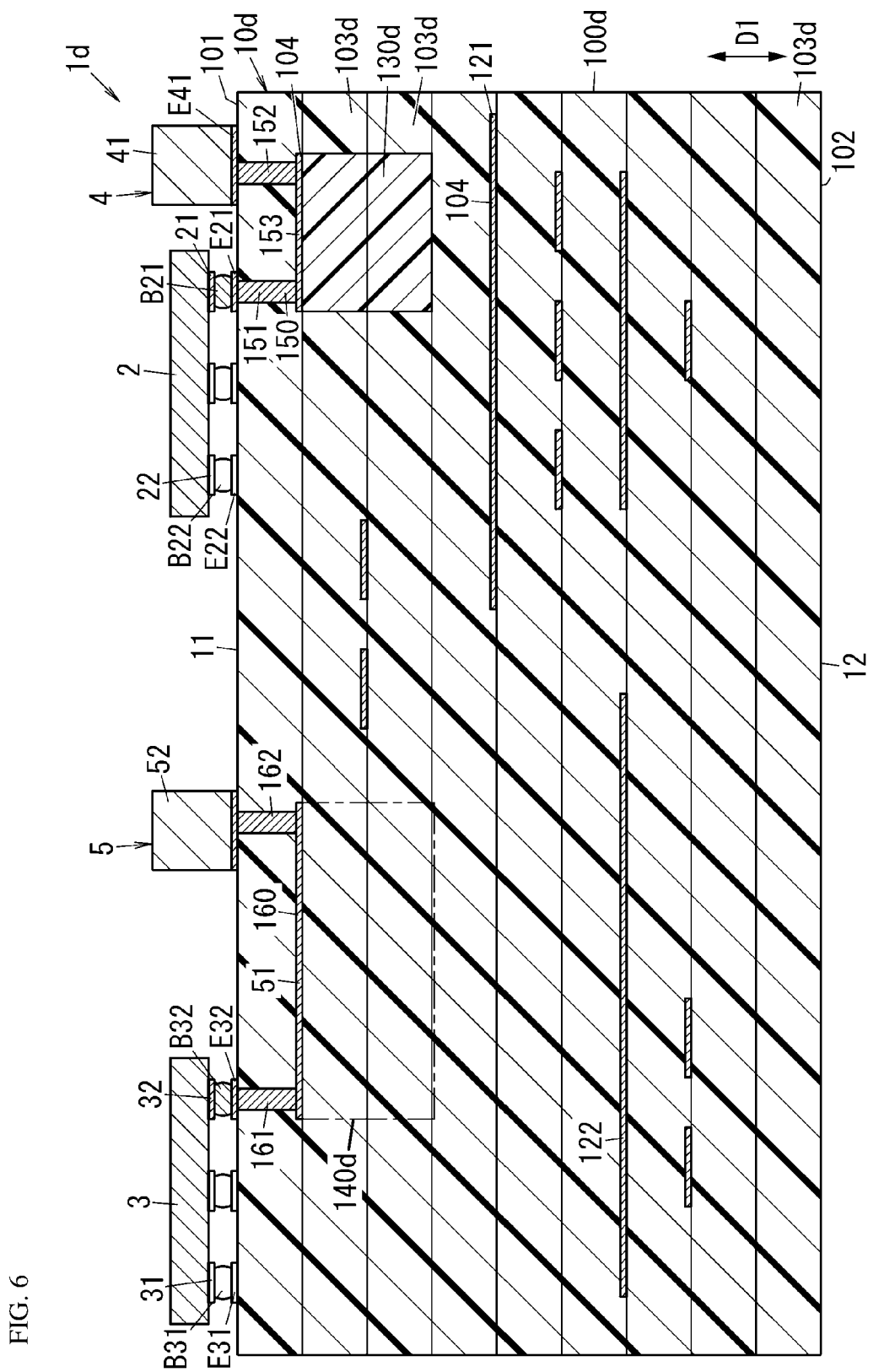
FIG. 6 is a cross-sectional view of a radio frequency module according to Embodiment 5 of the present disclosure.

Hereinafter, a radio frequency module 1d according to Embodiment 5 will be described with reference to FIG. 6.

The radio frequency module 1d according to Embodiment 5 is different from the radio frequency module 1 according to Embodiment 1 in that a substrate 10d is a printed wiring board. With respect to the radio frequency module 1d according to Embodiment 5, the same components as those of the radio frequency module 1 according to Embodiment 1 are denoted by the same reference numerals, and the description thereof will be omitted.

In the radio frequency module 1d according to Embodiment 5, each of a plurality of dielectric layers 103d includes resin. In the radio frequency module 1d according to Embodiment 5, the low permittivity portion 130d is resin having a lower permittivity than that of the dielectric layer 103d. In the radio frequency module 1d according to Embodiment 5, the high permittivity portion 140d is the same resin as that of the dielectric layer 103d.

A forming procedure of the substrate 10d as an example follows. A through-hole provided in a region where the low permittivity portion 130d is to be formed in a plurality of prepregs, which are the bases of the plurality of dielectric layers 103d, is filled with resin having the permittivity lower than that of the prepreg. The prepregs above and a plurality of prepregs in which the conductor pattern layer 104 and the like are formed in advance are laminated and cured.

In the radio frequency module 1d according to Embodiment 5, the substrate 10d includes a dielectric substrate 100d. The dielectric substrate 100d has the first main surface 101 and the second main surface 102. The first main surface 101 of the dielectric substrate 100d constitutes part of the first main surface 11 of the substrate 10d. The second main surface 102 of the dielectric substrate 100d constitutes at least part of the second main surface 12 of the substrate 10d.

In the radio frequency module 1d according to Embodiment 5, similarly to the radio frequency module 1 according to Embodiment 1, the low permittivity portion 130d is provided at a position between the first input terminal 21 of the low-noise amplifier 2 and the ground layer 121, the position overlapping with at least the first input terminal 21 in a plan view from the thickness direction D1 of the substrate 10d. In addition, the permittivity of the low permittivity portion 130d is smaller than the permittivity of the high permittivity portion 140d. Therefore, in the radio frequency module 1d according to Embodiment 5, it is possible to improve the NF of the low-noise amplifier 2.

In addition, in the radio frequency module 1d according to Embodiment 5, the substrate 10d is a printed wiring board. With this, in the radio frequency module 1d according to Embodiment 5, it is possible to reduce the permittivity of the dielectric substrate 100d as compared with the case where the substrate 10d is an LTCC substrate.

In addition, in the radio frequency module 1d according to Embodiment 5, the low permittivity portion 130d is resin. With this, in the radio frequency module 1d according to Embodiment 5, it is possible to easily form the low permittivity portion 130d.

Embodiment 6

Figure 7:
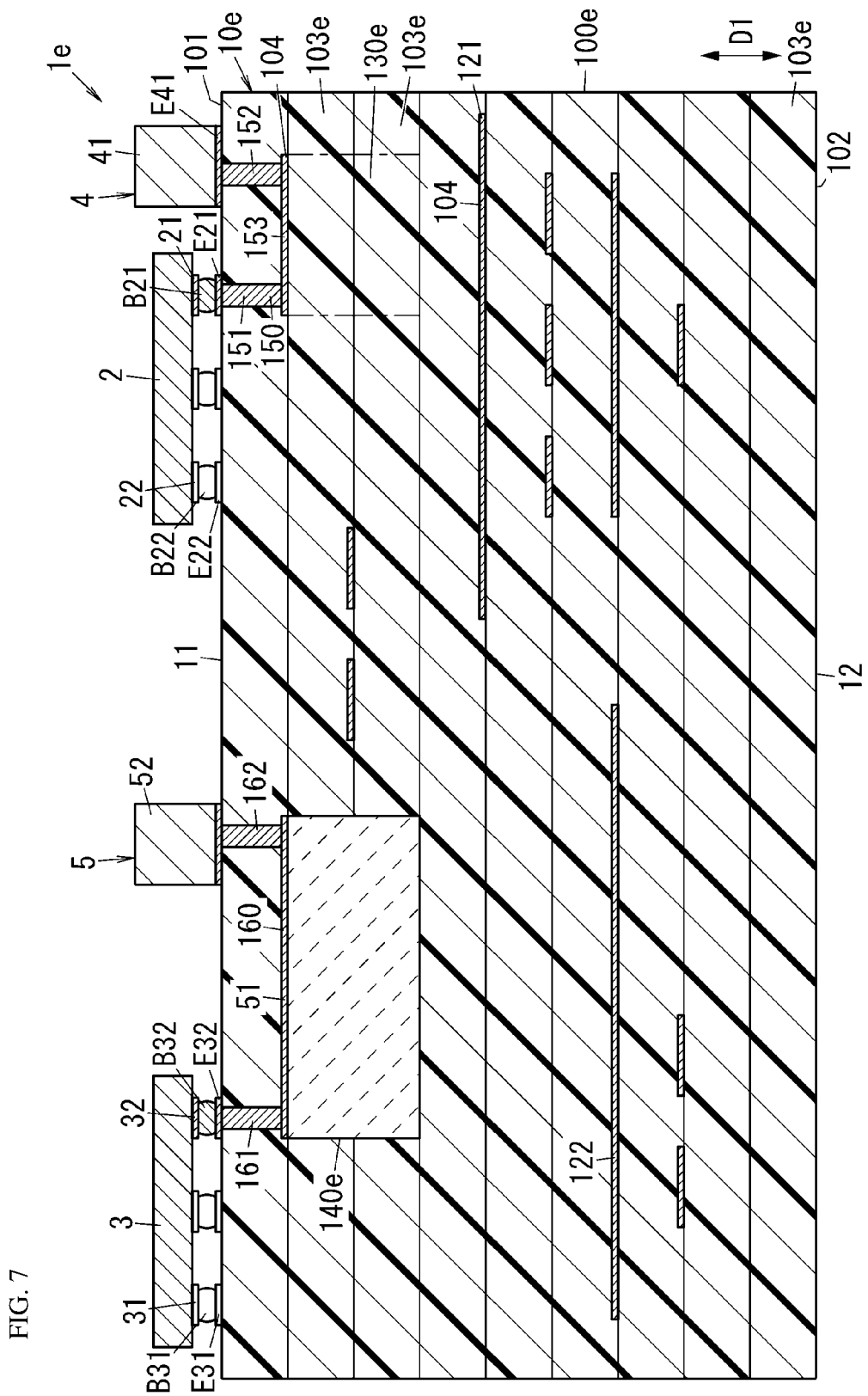
FIG. 7 is a cross-sectional view of a radio frequency module according to Embodiment 6 of the present disclosure.

Hereinafter, a radio frequency module 1e according to Embodiment 6 will be described with reference to FIG. 7.

The radio frequency module 1e according to Embodiment 6 is different from the radio frequency module 1d according to Embodiment 5 in that the permittivity of a high permittivity portion 140e is greater than that of a dielectric substrate 100e. The radio frequency module 1e according to Embodiment 6 is different from the radio frequency module 1d according to Embodiment 5 in that the permittivity of a low permittivity portion 130e is the same as the permittivity of the dielectric substrate 100e. In the radio frequency module 1e according to Embodiment 6, each of a plurality of dielectric layers 103e includes resin. With respect to the radio frequency module 1e according to Embodiment 6, the same components as those of the radio frequency module 1d according to Embodiment 5 are denoted by the same reference numerals, and the description thereof will be omitted.

In the radio frequency module 1e according to Embodiment 6, a substrate 10e includes the dielectric substrate 100e. The dielectric substrate 100e has the first main surface 101 and the second main surface 102. The first main surface 101 of the dielectric substrate 100e constitutes part of the first main surface 11 of the substrate 10e. The second main surface 102 of the dielectric substrate 100e constitutes at least part of the second main surface 12 of the substrate 10e. The substrate 10e satisfies the second condition. The second condition is a condition that satisfies: permittivity of low permittivity portion 130e≤permittivity of dielectric substrate 100e<permittivity of high permittivity portion 140e. With this, in the radio frequency module 1e according to Embodiment 6, it is possible to improve the NF of the low-noise amplifier 2.

In addition, in the radio frequency module 1e according to Embodiment 6, the substrate 10e is a printed wiring board. The substrate 10e satisfies the second condition. With this, in the radio frequency module 1e according to Embodiment 6, it is possible to improve both the NF of the low-noise amplifier 2 and the loss of the power amplifier 3 on the output side.

In addition, in the radio frequency module 1e according to Embodiment 6, the high permittivity portion 140e is an LTCC. With this, in the radio frequency module 1e according to Embodiment 6, it is possible to further improve the loss of the power amplifier 3 on the output side.

In the radio frequency module 1e according to Embodiment 6, the material of the low permittivity portion 130e is the same as that of the dielectric substrate 100e. With this, in the radio frequency module 1e according to Embodiment 6, it becomes easy to form the low permittivity portion 130e. The low permittivity portion 130e is not limited to the same material as that of the dielectric substrate 100e, and may be air, resin, or the like, for example.

Each of Embodiment 1 to Embodiment 6 described above and the like is merely the one of various embodiments of the present disclosure. Various changes may be made depending on the design and the like to the above-described Embodiment 1 to Embodiment 6.

For example, the substrates 10, 10a, 10b, and 10c of the radio frequency modules 1, 1a, 1b, and 1c are not limited to an LTCC substrate, and may be a high temperature co-fired ceramics (HTCC) substrate, for example.

In the radio frequency modules 1, 1a, 1b, 1c, 1d, and 1e, the antenna terminal T0, the signal input terminal T1, the signal output terminal T2, the antenna switch 6, the plurality of duplexers 71 to 74, the first switch 8, the second switch 9, the bias circuit 35, and the control circuit are optional constituting elements.

In the radio frequency module 1, the low permittivity portion 130 may be formed only in one dielectric layer 103, or may be formed in three or more consecutive dielectric layers 103. The same applies to the other radio frequency modules 1a to 1e.

In the radio frequency modules 1, 1a, 1c, 1d, and 1e, the ground layer 121 may be provided in the second main surface 102 instead of the dielectric substrates 100, 100a, 100c, 100d, and 100e.

Further, the power amplifier 3 is flip-chip mounted (face-down mounted) on the first main surface 11 or the second main surface 12, but the present disclosure is not limited thereto, and the power amplifier 3 may be face-up mounted.

SUMMARY

The following aspects have been disclosed in the embodiments and the like described above.

The radio frequency module (1; 1a; 1b; 1c; 1d; 1e) according to a first aspect includes a substrate (10; 10a; 10b; 10c; 10d; 10e), a low-noise amplifier (2), a power amplifier (3), and a matching circuit (second matching circuit 5). The substrate (10; 10a; 10b; 10c; 10d; 10e) has a first main surface (11) and a second main surface (12), and at least part of the substrate is dielectric. The low-noise amplifier (2) has a first input terminal (21) and a first output terminal (22), amplifies a first radio frequency signal inputted to the first input terminal (21), and outputs the amplified first radio frequency signal from the first output terminal (22). The low-noise amplifier (2) is flip-chip mounted on the first main surface (11) of the substrate (10; 10a; 10b; 10c; 10d; 10e). The power amplifier (3) has a second input terminal (31) and a second output terminal (32), amplifies a second radio frequency signal inputted to the second input terminal (31), and outputs the amplified second radio frequency signal from the second output terminal (32). The power amplifier (3) is mounted on the first main surface (11) or the second main surface (12) of the substrate (10; 10a; 10b; 10c; 10d; 10e). The matching circuit (second matching circuit 5) is electrically connected to the second output terminal (32) of the power amplifier (3). The matching circuit (second matching circuit 5) includes an inductor (second circuit element 51) that is connected in series to the power amplifier (3) and is formed on the first main surface (11) or in the substrate (10; 10a; 10b; 10c; 10d; 10e). The substrate (10; 10a; 10b; 10c; 10d; 10e) includes a ground layer (121), a low permittivity portion (130; 130a; 130b; 130c; 130d; 130e), and a high permittivity portion (140; 140c; 140d; 140e). The ground layer (121) at least partially overlaps with the first input terminal (21) in a plan view from the thickness direction (D1) of the substrate (10; 10a; 10b; 10c; 10d; 10e). The low permittivity portion (130; 130a; 130b; 130c; 130d; 130e) at least partially overlaps with the first input terminal (21) in a plan view from the thickness direction (D1), and is provided between the first input terminal (21) and the ground layer (121). The high permittivity portion (140; 140c; 140d; 140e) is in contact with the inductor (second circuit element 51), and has a permittivity greater than that of the low permittivity portion (130; 130a; 130b; 130c; 130d; 130e).

In the radio frequency module (1; 1a; 1b; 1c; 1d; 1e) according to the first aspect, it is possible to improve at least one of the NF of the low-noise amplifier (2) and the loss of the power amplifier (3) on the output side.

In the radio frequency module (1; 1a; 1b; 1c; 1d) according to a second aspect, the substrate (10; 10a; 10b; 10c; 10d) includes a dielectric substrate (100; 100a; 100b; 100c; 100d) in the first aspect. The dielectric substrate (100; 100a; 100b; 100c; 100d) has a first main surface (101) and a second main surface (102). The first main surface (101) of the dielectric substrate (100; 100a; 100b; 100c; 100d) constitutes part of the first main surface (11) of the substrate (10; 10a; 10b; 10c; 10d). The second main surface (102) of the dielectric substrate (100; 100a; 100b; 100c; 100d) constitutes at least part of the second main surface (12) of the substrate (10; 10a; 10b; 10c; 10d). The substrate (10; 10a; 10b; 10c; 10d) satisfies a first condition or a second condition. The first condition is a condition that satisfies: permittivity of low permittivity portion (130; 130a; 130b; 130c; 130d)<permittivity of dielectric substrate (100; 100a; 100b; 100c; 100d) ≤permittivity of high permittivity portion (140; 140c; 140d). The second condition is a condition that satisfies: permittivity of low permittivity portion (130e)≤permittivity of dielectric substrate (100e)<permittivity of high permittivity portion (140e).

In the radio frequency module (1; 1a; 1b; 1c; 1d; 1e) according to the second aspect, it is possible to improve the NF of the low-noise amplifier (2).

In the radio frequency module (1; 1a; 1b; 1c) according to a third aspect, the substrate (10; 10a; 10b; 10c) is an LTCC substrate in the second aspect. The substrate (10; 10a; 10b; 10c) satisfies the first condition.

In the radio frequency module (1; 1a; 1b; 1c) according to the third aspect, it is possible to improve both the NF of the low-noise amplifier (2) and the loss of the power amplifier (3) on the output side.

In the radio frequency module (1; 1a; 1b; 1c) according to a fourth aspect, the low permittivity portion (130; 130a; 130b; 130c) is air or resin in the third aspect.

In the radio frequency module (1; 1a; 1b; 1c) according to the fourth aspect, it is possible to make the permittivity of the low permittivity portion (130; 130a; 130b; 130c) smaller than the permittivity of the dielectric substrate (100; 100a; 100b; 100c).

In the radio frequency module (1; 1a; 1b; 1c) according to a fifth aspect, the material of the high permittivity portion (140; 140c) is the same as that of the dielectric substrate (100; 100a; 100b; 100c) in the third or the fourth aspect.

In the radio frequency module (1; 1a; 1b; 1c) according to the fifth aspect, it becomes easy to form the high permittivity portion (140; 140c).

In the radio frequency module (1e) according to a sixth aspect, the substrate (10e) is a printed wiring board in the second aspect. The substrate (10e) satisfies the second condition.

In the radio frequency module (1e) according to the sixth aspect, it is possible to improve both the NF of the low-noise amplifier (2) and the loss of the power amplifier (3) on the output side.

In the radio frequency module (1e) according to a seventh aspect, the high permittivity portion (140e) is an LTCC in the sixth aspect.

In the radio frequency module (1e) according to the seventh aspect, it is possible to further improve the loss of the power amplifier (3) on the output side.

In the radio frequency module (1e) according to an eighth aspect, the low permittivity portion (130e) is air, resin or the same material as that of the dielectric substrate (100e) in the sixth or seventh aspect.

In the radio frequency module (1e) according to the eighth aspect, it is possible to further reduce the permittivity of the low permittivity portion (130e).

The radio frequency module (1; 1a; 1b; 1c; 1d; 1e) according to a ninth aspect further includes a first matching circuit (4) and a bump (B21) in the second to eighth aspects. The first matching circuit (4) includes a first circuit element (41) and is electrically connected to the first input terminal (21) of the low-noise amplifier (2). The bump (B21) is bonded to the first input terminal (21) of the low-noise amplifier (2). The matching circuit is a second matching circuit (5). The substrate (10; 10a; 10b; 10c; 10d; 10e) includes an electrode (E21). The electrode (E21) is provided on the first main surface (101) of the dielectric substrate (100; 100a; 100b; 100c; 100d; 100e) and faces the first input terminal (21), and the bump (B21) is bonded to the electrode (E21). The ground layer (121) faces the electrode (E21) in the thickness direction (D1).

In the radio frequency module (1; 1a; 1b; 1c; 1d; 1e) according to the ninth aspect, it is possible to reduce the NF of the low-noise amplifier (2) while suppressing the loss of the power amplifier (3) on the output side.

In the radio frequency module (1; 1a; 1b; 1c; 1d; 1e) according to a tenth aspect, the substrate (10; 10a; 10b; 10c; 10d; 10e) further includes a wiring (150; 150a; 150b) electrically connecting the first circuit element (41) and the first input terminal (21) in the ninth aspect. The low permittivity portion (130; 130a; 130b; 130c; 130d; 130e) is positioned between a portion of the wiring (150; 150a; 150b) facing the ground layer (121) in the thickness direction (D1) and the ground layer (121).

In the radio frequency module (1; 1a; 1b; 1c; 1d; 1e) according to the tenth aspect, it is possible to connect the first input terminal (21) of the low-noise amplifier (2) and the first circuit element (41) by the wiring (150; 150a; 150b) of the substrate (10; 10a; 10b; 10c; 10d; 10e). In the radio frequency module (1; 1a; 1b; 1c; 1d; 1e) according to the tenth aspect, since it is possible to reduce the parasitic capacitance generated between the wiring (150; 150a; 150b) having substantially the same electric potential as the first input terminal (21) and the ground layer (121), it is possible to reduce the NF of the low-noise amplifier (2).

In the radio frequency module (1; 1b; 1c; 1d; 1e) according to an eleventh aspect, the first circuit element (41) is a chip inductor in the tenth aspect. The wiring (150; 150b) includes a first via conductor (151), a second via conductor (152), and a conductor portion (153). The first via conductor (151) is provided in the dielectric substrate (100; 100b; 100c; 100d; 100e), and overlaps with the electrode (E21) in the thickness direction (D1) and is connected to the electrode (E21). The second via conductor (152) is provided in the dielectric substrate (100; 100b; 100c; 100d; 100e), overlaps with the first circuit element (41) in the thickness direction (D1), and is electrically connected to the first circuit element (41). The conductor portion (153) is provided in the dielectric substrate (100; 100b; 100c; 100d; 100e), and connects the first via conductor (151) and the second via conductor (152). The low permittivity portion (130; 130b; 130c; 130d; 130e) is provided between a portion of the conductor portion (153) overlapping with at least the first via conductor (151) in a plan view from the thickness direction (D1) and the ground layer (121).

In the radio frequency module (1; 1b; 1c; 1d; 1e) according to the eleventh aspect, it is possible to reduce the NF compared with the case where the low permittivity portion (130; 130b; 130c; 130d; 130e) is not provided between a portion overlapping with the first via conductor (151) in the thickness direction (D1) and the ground layer (121), and the low permittivity portion (130; 130b; 130c; 130d; 130e) is provided between a portion not overlapping with the first via conductor (151) in the thickness direction (D1) and the ground layer 121. In addition, in the radio frequency module (1; 1b; 1c; 1d; 1e) according to the eleventh aspect, it is possible to reduce a region in which the low permittivity portion (130; 130b; 130c; 130d; 130e) is provided in a plane orthogonal to the thickness direction (D1).

In the radio frequency module (1a) according to a twelfth aspect, the first circuit element (41) is a chip inductor in the tenth aspect. The substrate (10a) further includes a land (E41) which is provided on the first main surface (101) of the dielectric substrate (100a) and is electrically connected to the first circuit element (41). A wiring (150a) is provided on the first main surface (101) of the dielectric substrate (100a), and connects the electrode (E21) and the land (E41).

In the radio frequency module (1a) according to the twelfth aspect, it is possible to further reduce the parasitic capacitance caused by the wiring (150a).

In the radio frequency module (1b) according to a thirteenth aspect, the substrate (10b) further includes the land (E41) which is provided on the second main surface (102) of the dielectric substrate (100b) and is electrically connected to the first circuit element (41) in the eleventh aspect.

In the radio frequency module (1b) according to the thirteenth aspect, the low-noise amplifier (2) may be disposed on the first main surface (101) side of the dielectric substrate (100b), and the power amplifier (3) may be disposed on the second main surface (102) side of the dielectric substrate (100b).

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A radio frequency module comprising:
   a substrate comprising a first main surface and a second main surface, at least part of the substrate being dielectric;
   a low-noise amplifier that comprises a first input terminal and a first output terminal, that is configured to amplify a first radio frequency signal inputted to the first input terminal and to output an amplified first radio frequency signal from the first output terminal, and that is flip-chip mounted on the first main surface of the substrate;

a power amplifier that comprises a second input terminal and a second output terminal, that is configured to amplify a second radio frequency signal inputted to the second input terminal and to output an amplified second radio frequency signal from the second output terminal, and that is mounted on the first main surface or on the second main surface of the substrate; and a matching circuit that is electrically connected to the second output terminal of the power amplifier and that comprises an inductor connected in series to the power amplifier, the inductor being on the first main surface of the substrate or in the substrate, wherein the substrate further comprises:
a ground layer that at least partially overlaps the first input terminal when the substrate is seen in a plan view from a thickness direction of the substrate,
a low permittivity portion that at least partially overlaps the first input terminal in the plan view, and that is between the first input terminal and the ground layer, and
a high permittivity portion that is in contact with the inductor and that has a permittivity greater than a permittivity of the low permittivity portion.

2. The radio frequency module according to claim 1, wherein:
the substrate comprises a dielectric substrate comprising a first main surface and a second main surface,
the first main surface of the dielectric substrate is part of the first main surface of the substrate, and the second main surface of the dielectric substrate is at least part of the second main surface of the substrate, and either:
the permittivity of the low permittivity portion is less than a permittivity of the dielectric substrate and the permittivity of the dielectric substrate is less than or equal to the permittivity of the high permittivity portion, or
the permittivity of the low permittivity portion is less than or equal to the permittivity of the dielectric substrate and the permittivity of the dielectric substrate is less than the permittivity of the high permittivity portion.

3. The radio frequency module according to claim 2, wherein:
the substrate is a low temperature co-fired ceramics (LTCC) substrate, and
the permittivity of the low permittivity portion is less than the permittivity of the dielectric substrate and the permittivity of the dielectric substrate is less than or equal to the permittivity of the high permittivity portion.

4. The radio frequency module according to claim 3, wherein the low permittivity portion comprises air or resin.

5. The radio frequency module according to claim 3, wherein a material of the high permittivity portion is the same as a material of the dielectric substrate.

6. The radio frequency module according to claim 2, wherein:
the substrate is a printed wiring board, and
the permittivity of the low permittivity portion is less than or equal to the permittivity of the dielectric substrate and the permittivity of the dielectric substrate is less than the permittivity of the high permittivity portion.

7. The radio frequency module according to claim 6, wherein the high permittivity portion is a low temperature co-fired ceramics (LTCC).

8. The radio frequency module according to claim 6, wherein the low permittivity portion comprises air, resin, or the same material as a material of the dielectric substrate.

9. The radio frequency module according to claim 2, further comprising:
a first matching circuit comprising a first circuit element mounted on the substrate, the first matching circuit being electrically connected to the first input terminal of the low-noise amplifier; and
a bump bonded to the first input terminal of the low-noise amplifier, wherein:
the substrate further comprises an electrode that is on the first main surface of the dielectric substrate, that faces the first input terminal, and that is bonded to the bump, and
the ground layer faces the electrode in the thickness direction.

10. The radio frequency module according to claim 9, wherein:
the substrate further comprises a wiring that electrically connects the first circuit element and the first input terminal, and
the low permittivity portion is between the ground layer and a portion of the wiring that faces the ground layer in the thickness direction.

11. The radio frequency module according to claim 10, wherein:
the first circuit element is a chip inductor,
the wiring comprises:
a first via conductor that is in the dielectric substrate, that overlaps the electrode in the thickness direction, and that is connected to the electrode;
a second via conductor that is in the dielectric substrate, that overlaps the first circuit element in the thickness direction, and that is electrically connected to the first circuit element; and
a conductor portion that is in the dielectric substrate and that connects the first via conductor and the second via conductor, and
the low permittivity portion is between the ground layer and a portion of the conductor portion that overlaps at least the first via conductor in the plan view.

12. The radio frequency module according to claim 10, wherein:
the first circuit element is a chip inductor,
the substrate further comprises a land that is on the first main surface of the dielectric substrate and that is electrically connected to the first circuit element, and
the wiring is on the first main surface of the dielectric substrate and connects the electrode and the land.

13. The radio frequency module according to claim 11, wherein the substrate further comprises a land that is on the second main surface of the dielectric substrate and that is electrically connected to the first circuit element.

* * * * *